United States Patent
Hussey, Jr. et al.

(10) Patent No.: US 6,728,591 B1
(45) Date of Patent: Apr. 27, 2004

(54) METHOD AND APPARATUS FOR RUN-TO-RUN CONTROL OF TRENCH PROFILES

(75) Inventors: James H. Hussey, Jr., Austin, TX (US); Matthew A. Purdy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 218 days.

(21) Appl. No.: 09/920,098

(22) Filed: Aug. 1, 2001

(51) Int. Cl.[7] .............................................. G06F 19/00
(52) U.S. Cl. ........................... 700/121; 216/59; 700/45
(58) Field of Search ............................. 700/28, 44, 45, 700/95–110, 117–125; 216/58, 59, 83, 84

(56) References Cited

U.S. PATENT DOCUMENTS

| | | | | |
|---|---|---|---|---|
| 4,345,968 A | * | 8/1982 | Coe ........................... 156/627 |
| 5,270,222 A | * | 12/1993 | Moslehi ........................ 437/8 |
| 5,576,629 A | * | 11/1996 | Turner et al. ............... 324/709 |
| 5,578,161 A | * | 11/1996 | Auda ....................... 156/626.1 |
| 6,060,328 A | * | 5/2000 | En et al. ........................ 438/9 |
| 6,081,334 A | * | 6/2000 | Grimbergen et al. ........ 356/357 |
| 6,161,054 A | * | 12/2000 | Rosenthal et al. ........... 700/121 |
| 6,268,293 B1 | * | 7/2001 | Clevenger et al. .......... 438/706 |
| 6,486,675 B1 | * | 11/2002 | Jaiprakash et al. ......... 324/533 |
| 6,548,414 B2 | * | 4/2003 | Athavale et al. ............ 438/706 |
| 6,625,514 B1 | * | 9/2003 | Lensing ....................... 700/121 |
| 2002/0155629 A1 | * | 10/2002 | Fairbairn et al. ............. 438/14 |
| 2003/0010750 A1 | * | 1/2003 | Petrucci et al. ............... 216/59 |

OTHER PUBLICATIONS

Yuri Karzhavin, "Advanced Process Control Project at Infineon Technologies, Richmond" Feb. 2, 2002, Future Fab vol. 12.*

Yuri Karzhavin, "Improving equipment productivity through on–product etch–process monitoring" Apr. 30–May 2, 2002, IEEE/SEMI Advanced Semiconductor Manufacturing Conference, Boston.*

* cited by examiner

Primary Examiner—Leo Picard
Assistant Examiner—Sean Shechtman
(74) Attorney, Agent, or Firm—Williams, Morgan & Amerson, P.C.

(57) ABSTRACT

A method and an apparatus are provided for performing run-to-run control of trench profiles. At least one semiconductor wafer is processed. A trench metrology data from the processed semiconductor wafer is acquired. Data relating to at least one process chamber characteristic is acquired while processing the semiconductor wafer. A chamber characteristic adjustment process is performed in response to the trench metrology data and the data relating to the processing chamber characteristic. A feedback adjustment of the processing chamber characteristic is performed in response to the chamber characteristic adjustment process.

27 Claims, 8 Drawing Sheets

METHOD AND APPARATUS FOR RUN-TO-RUN CONTROL OF TRENCH PROFILES

BACKGROUND OF THE INVENTION

1. Field of the Invention

This invention relates generally to semiconductor manufacturing, and, more particularly, to a method and apparatus for performing process control adjustments based upon trench profiles.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a gate electrode structure for transistors. Typically, shallow trench isolation (STI) structures formed on the semiconductor wafers are filled by forming silicon dioxide using tetraethoxysilane (TEOS), over the wafer and in the STI structures. The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 103 arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer.

Turning now to FIG. 2, a silicon substrate 210 that contains a plurality of layers 220, 230, is shown. In one embodiment, a layer of silicon nitride is added on the surface 215 of the silicon substrate 210, producing the layer 220. Trenches 240 are formed that extend through layer 220 of silicon nitride and into the silicon substrate 210. Any of a variety of etching processes may be employed to create the trench 240. The trenches 240 in the silicon substrate 210 generally have a finite trench depth 250. The trench depth 250 extends from the bottom of the trench 240 to a top surface of the semiconductor wafer. Generally, the silicon nitride layers 220 are removed in the finished product.

FIG. 2 also illustrates a pre-polished layer of silicon dioxide material deposited on the silicon substrate 210, which is represented by layer 230. Generally, TEOS, which is a source gas, is used in the deposition process. Ideally, the silicon dioxide completely fills the trench depth 250.

Maintaining predetermined trench profile characteristics, such as trench depth 250, is important in semiconductor wafer manufacturing. Trench characteristics can affect the performance of a device manufactured from a processed semiconductor wafer. For example, variations in STI structures formed on a semiconductor wafer can affect the electrical characteristics of the semiconductor wafer. This, in turn, can affect the quality of devices produced from the processed semiconductor wafers.

Controlling trench profile characteristics during semiconductor wafer processing is generally difficult. Many times, loss of control of processing of trench structures on layers of semiconductor wafers can cause excessive variations among trench structures on the semiconductor wafers 105. These variations can cause undesirable electrical characteristics associated with the operation of devices manufactured from the semiconductor wafers.

Turning now to FIG. 3, trenches 240 formed in a process layer 210 is illustrated. During processing of trench structures, loss of control can result in a trench depth 250 that is larger or smaller than a predetermined target value, or a range of values. A trench 240 with incorrect trench depth 250 can result in defective semiconductor wafers 105. Furthermore, loss of control of processing of trench structures can result in diminished ability to form trench structures that contain sidewalls 305 at the appropriate angles. The sidewall angle, θ, 320 can be greater or smaller than a predetermined target value, or a range of values. Variations in the sidewall angle 320 can cause undesirable fluctuations in the electrical characteristics of structures associated with the trenches 240, resulting in defective semiconductor wafers 105.

Generally, when loss of control of processing of trench structures occurs, many actions may be taken. For example, the processing chamber, e.g., etch chamber, in which the trench structures are formed, may be shut down and cleaned in an effort to return the chamber to a known steady state condition. The control of processing of trench structures is then re-initiated. However, the shutting down of a process chamber is inefficient and delays manufacturing of semiconductor wafers. Furthermore, frequent cleaning of process chambers requires a manufacturing system to constantly re-establish control of processing of trench structures from an initial state, resulting in additional delays and expenses.

The present invention is directed to overcoming, or at least reducing the effects of, one or more of the problems set forth above.

SUMMARY OF THE INVENTION

In one aspect of the present invention, a method is provided for performing run-to-run control of trench profiles. At least one semiconductor wafer is processed. A trench metrology data from the processed semiconductor wafer is acquired. Data relating to at least one process chamber characteristic, the data acquired while processing the semiconductor wafer is acquired. A chamber characteristic adjustment process is performed in response to the trench metrology data and the data relating to the processing chamber characteristic. A feedback adjustment of the processing chamber characteristic is performed in response to the chamber characteristic adjustment process.

In another aspect of the present invention, a system is provided for performing run-to-run control of trench profiles. The system of the present invention comprises: a metrology data storage unit to receive trench metrology data; a chamber data storage to receive chamber characteristic data relating to a processing of a semiconductor wafer; a chamber characteristic/metrology data correlation unit operatively coupled with the metrology data storage unit and the chamber data storage unit, the chamber characteristic/metrology data correlation unit to correlate the trench metrology data with corresponding chamber characteristic data; and a chamber control model to modify a chamber characteristic during a time period of processing of a semiconductor wafer based upon the correlated trench metrology data and corresponding chamber characteristic data.

BRIEF DESCRIPTION OF THE DRAWINGS

The invention may be understood by reference to the following description taken in conjunction with the accompanying drawings, in which like reference numerals identify like elements, and in which.

Figure 1:
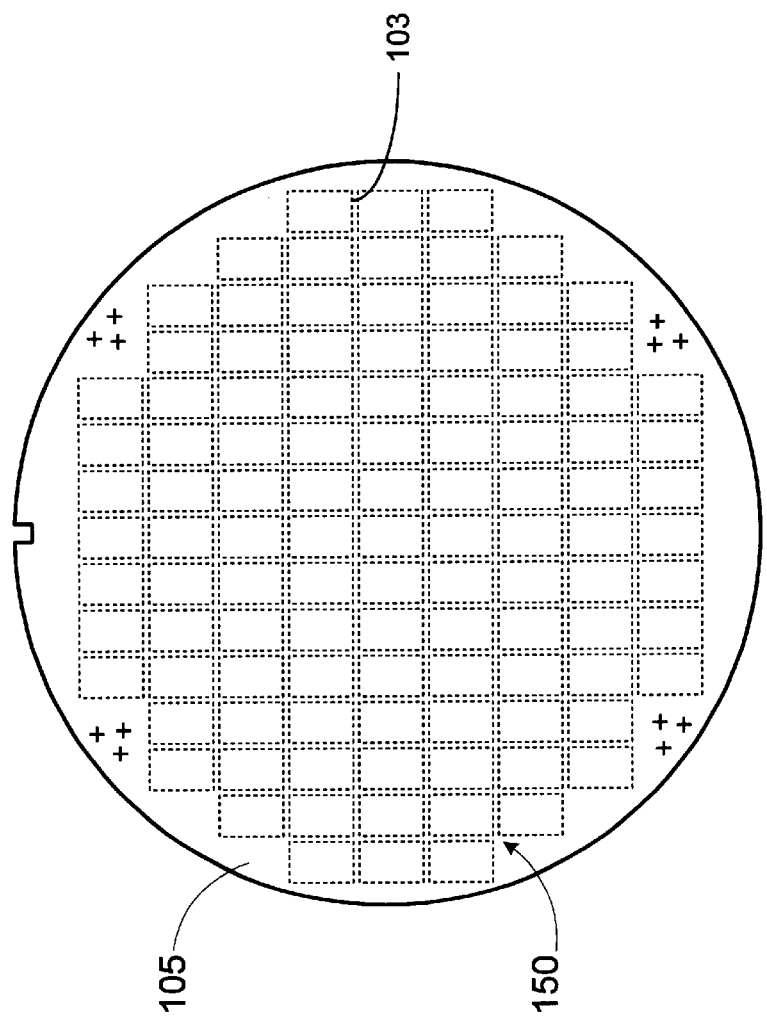
FIG. 1 is a simplified diagram of a prior art semiconductor wafer being processed.
Figure 2:
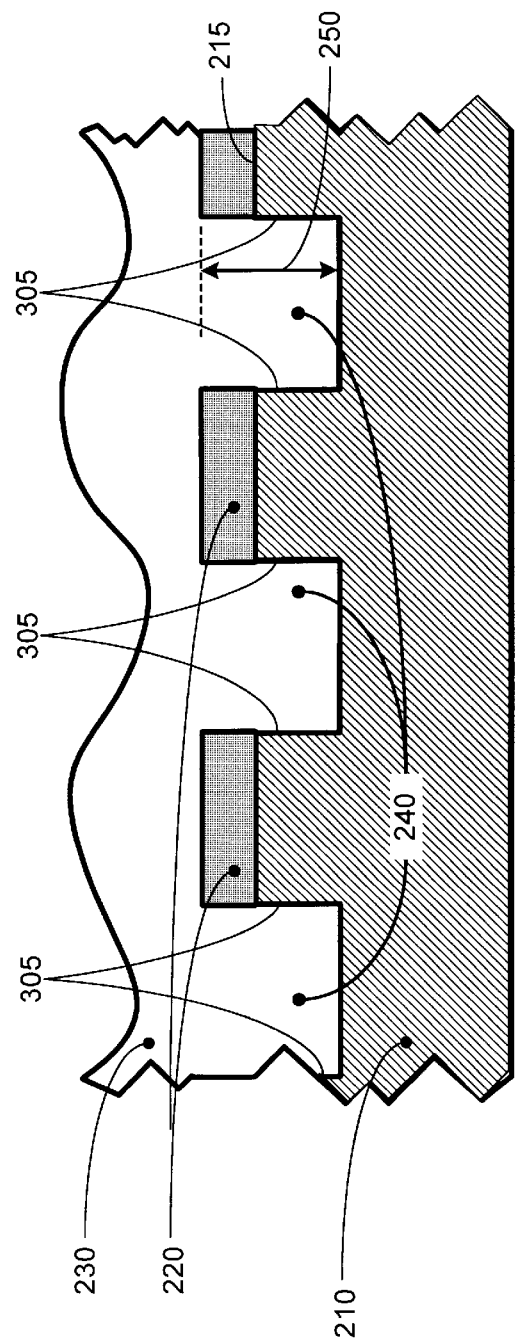
FIG. 2 is a cross-section view of a semiconductor wafer, where a plurality of trench structures are formed on a layer of the semiconductor wafer.
Figure 3:
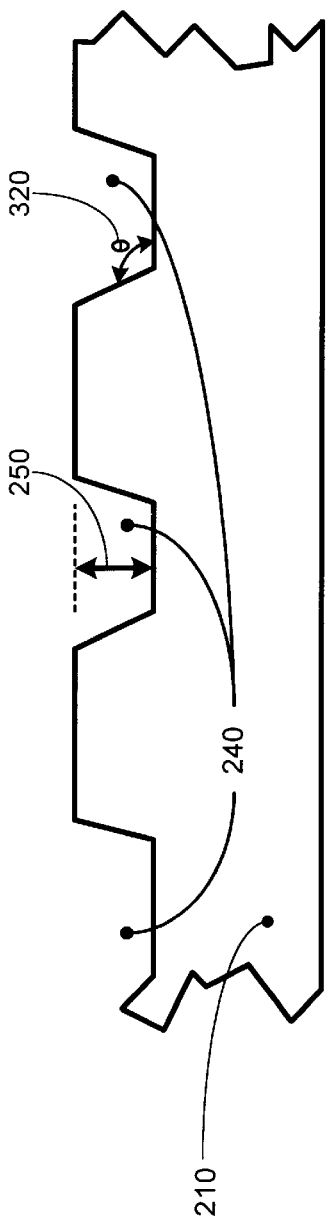
FIG. 3 is a cross-section view of a semiconductor wafer illustrating a trench depth and a sidewall angle of a trench structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Errors that result from unintended variations in trench structure characteristics can cause undesirable fluctuations in the electrical characteristics of the trench structures. Generally, lack of control of trench structure process operations can cause excessive variations in trench characteristics. Embodiments of the present invention provide for maintaining improved control of operations of trench structure process operations. Embodiments of the present invention provide for controlling environmental factors of the process chamber such that improved control of trench structure process operations is achieved.

Figure 4:
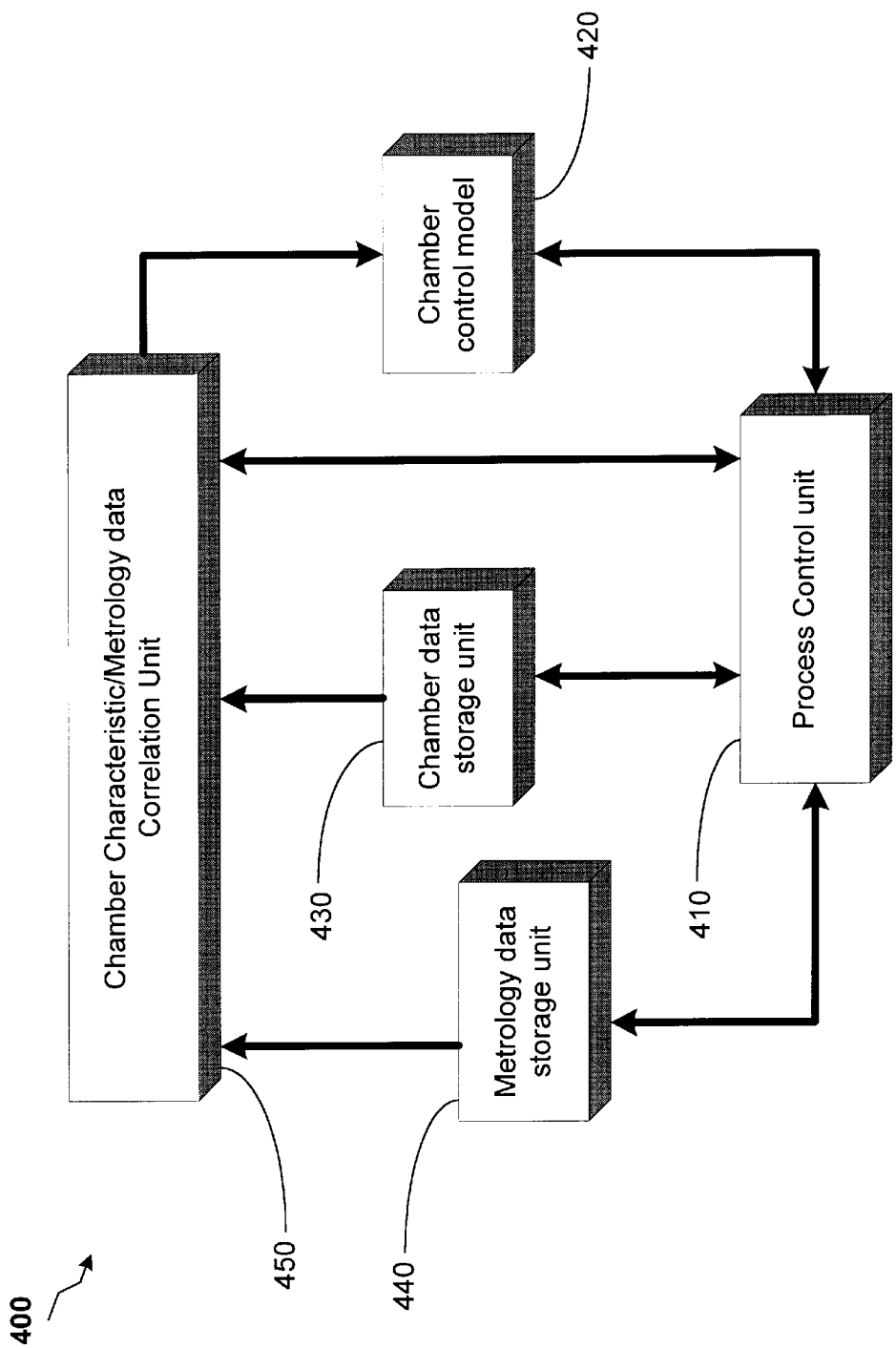
FIG. 4 is a block diagram representation of a system in accordance with one embodiment of the present invention.

Turning now to FIG. 4, one embodiment of a system 400 in accordance with the present invention is illustrated. The system 400 illustrated in FIG. 4 comprises a process control unit 410 (e.g., a controller), a chamber control model 420, a chamber data storage unit 430, a metrology data storage unit 440, and a chamber characteristics/metrology data correlation 450. In one embodiment, the structures represented by blocks 410, 420, 430 and 450 may be incorporated into a single computing unit. In an alternative embodiment, the structures represented by blocks 410, 420, 430 and 450 may comprise partially or wholly of software algorithms. In yet another embodiment, structures represented by blocks 410, 420, 430 and 450 may be created from firmware objects.

The process control unit 410 controls a manufacturing environment in which semiconductor wafers 105 are processed. In one embodiment, an automated process control, such as the Advanced Process Control framework (APC), is integrated within the process control unit 410. The process control unit 410 is capable of receiving a plurality of inputs, such as feedback data relating to processed semiconductor wafer 105, and adjusting control parameters that are used to process semiconductor wafers 105. The process control unit 410, receives data relating to a chamber that processes semiconductor wafers 105. The chamber data storage 430, which is capable of storing data, stores data associated with the chamber in which semiconductor wafers 105 are processed. Data associated with the chamber include, among other things, the chamber pressure, chamber temperature, and the process gasses that are used for manufacturing of semiconductor wafers 105.

The process control unit 410 also prompts the acquisition of trench metrology data from processed semiconductor wafers 105.

The trench metrology data may include data indicating errors in the trench profile relation to a predetermined target value, or range of values. For example, such trench metrology data may indicate when the depth of the trench varies from the target value for the depth. Metrology data is stored in the metrology storage data unit 440. The chamber data storage 430 and metrology data storage unit 440 send their respective data to the chamber characteristics/metrology data correlation unit 450. The correlation 450 correlates particular metrology error data and corresponding chamber characteristics to develop a relationship between metrology errors (trench structure errors) and chamber characteristics. This relationship is analyzed by the process control unit 410. In response, the process control unit 410 modifies certain parameters relating to the chamber, such as temperature, pressure, and chamber process gas, by modifying the chamber control model 420. The chamber control model 420 then drives the operation of the chamber in which semiconductor wafers 105 are processed.

Figure 5:
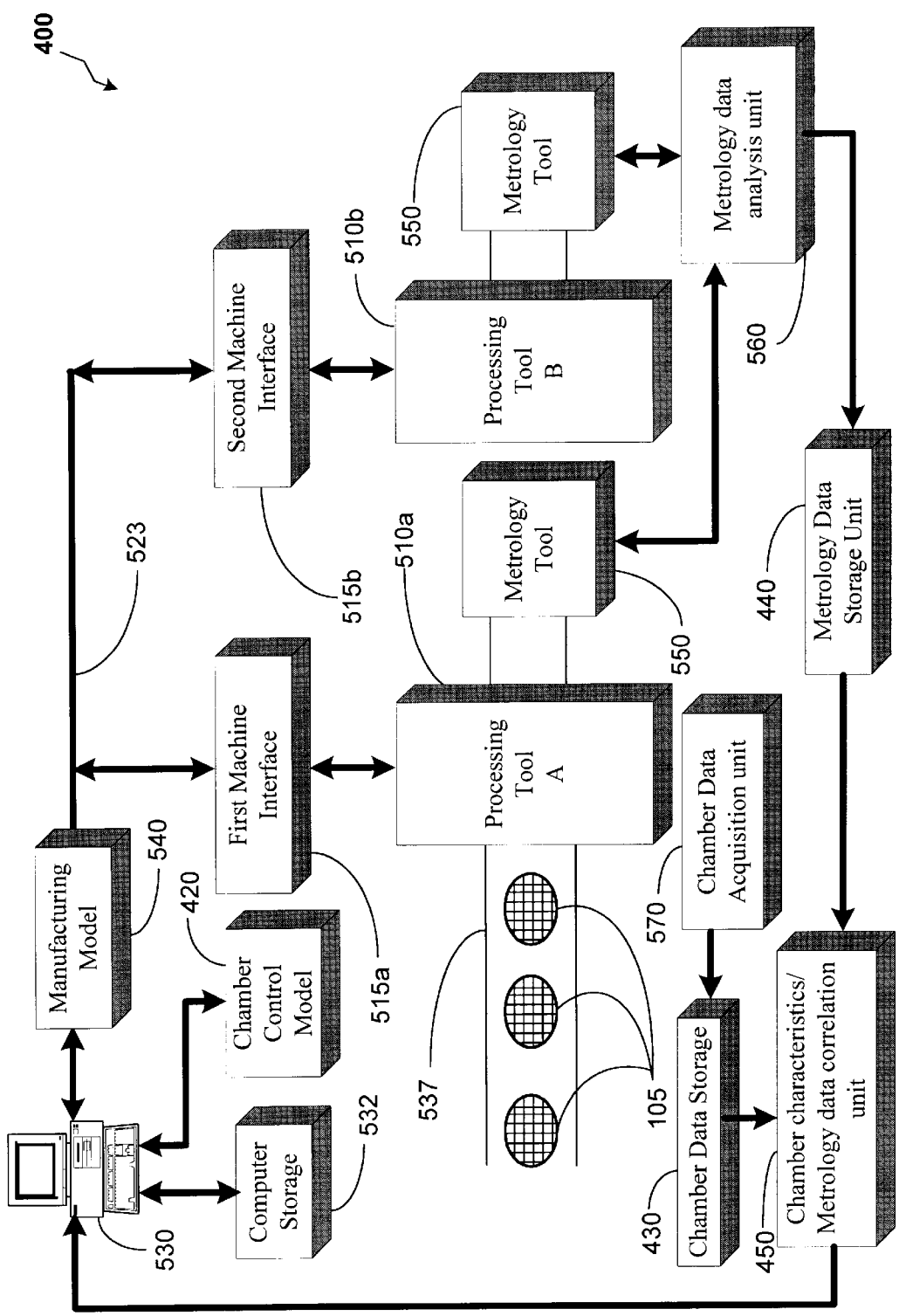
FIG. 5 illustrates a more detailed block diagram representation of the system in accordance with one embodiment of the present invention.

Turning now to FIG. 5, a more detailed block diagram of the system 400 in accordance with one embodiment of the present invention is illustrated. In one embodiment, semiconductor wafers 105, are processed on processing tools 510a, 510b using a plurality of control input signals, or manufacturing parameters, on a line 523. In one embodiment, control input signals, or manufacturing parameters, on the line 523 are sent to the processing tools 510a, 510b from a computer system 530 via machine interfaces 515a, 515b. In one embodiment, the first and second machine interfaces 515a, 515b are located outside the processing tools 510a, 510b. In an alternative embodiment, the first and second machine interfaces 515a, 515b are located within the processing tools 510a, 510b. A processing line 537 carries semiconductor wafers 105 to and from a plurality of processing tools 510. In one embodiment, semiconductor wafer 105 may be provided to a processing tool 510 manually. In an alternative embodiment, semiconductor wafer 105 may be provided to a processing tool 510 in an automatic fashion (e.g., robotic movement of semiconductor wafer 105). In one embodiment, a plurality of semiconductor wafers 105 are transported in lots (not shown) to the processing tools 510.

In one embodiment, the computer system 530 sends control input signals, or manufacturing parameters, on the line 523 to the first and second machine interfaces 515a, 515b. The computer system 530 is capable of controlling processing operations. The computer system 530 is coupled to a computer storage 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523.

In one embodiment, the manufacturing model 540 defines a process script and input control that implement a particular manufacturing process. The control input signals on the line 523 that are intended for processing tool A 510a are received and processed by the first machine interface 515a. The control input signals on the line 523 that are intended for processing tool B 510b are received and processed by the second machine interface 515b. Examples of the processing tools 510a, 510b used in semiconductor manufacturing processes are steppers, etch process tools, and the like.

One or more of the semiconductor wafers 105 that are processed by the processing tools 510a, 510b can also be sent to a metrology tool 550 for acquisition of metrology data. The metrology tool 550 can be a scatterometry data acquisition tool, a critical dimension measurement tool, and the like. In one embodiment, one or more processed semiconductor wafers 105 are examined by a metrology tool 550. Data from the metrology tool 550 is collected by a metrology data analyzer unit 560. The data may include depth of trenches 250, sidewall angles 320, and the like. The metrology data analyzer unit 560 organizes, analyses, and correlates metrology data acquired by the metrology tool 550 to particular semiconductor wafers 105 that were examined. The metrology data analyzer unit 560 can be a software unit, a hardware unit, or a firmware unit. In various embodiments, the metrology data analyzer unit 560 is integrated into the computer system 530 or may be integrated into the metrology tool 550. In one embodiment, the metrology data analysis unit 560 stores metrology data in the metrology data storage unit 440. The metrology data stored in the metrology data storage unit 440 includes sets of data that represent the trench depth 250 and the side-wall angle 320 of trench structures formed on layer of the semiconductor wafer 105.

A chamber data acquisition unit 570 acquires data relating to chamber characteristics during operation of the processing tools 510. The chamber data acquisition unit 570 acquires data such as chamber temperature, chamber pressure, process gasses present in the chamber during processing operations, and the like. In one embodiment, the chamber data acquisition unit 570 comprises a plurality of sensors embedded into a chamber in which semiconductor wafers 105 are processed. Data relating to the chamber characteristics is stored in the chamber data storage 430. As described above, the chamber data storage 430 and metrology data storage unit 440 send their respective data to the chamber characteristics/metrology data correlation unit 450. The correlation unit 450 correlates particular metrology error data and corresponding chamber characteristics to develop a relationship between metrology errors and chamber characteristics. This relationship is analyzed by the computer system 530. In response, the computer system 530 modifies certain parameters relating to the chamber, such as temperature, pressure, and process gas, by modifying the chamber control model 420. The chamber control model 420 then drives or controls the operation of the chamber in which semiconductor wafers 105 are processed.

In one embodiment, one or more of the chamber data acquisition unit 570, the chamber control model 420, the chamber data storage 430, the metrology data storage unit 440, and the chamber characteristics/metrology data correlation 450 are integrated within the computer system 530. In an alternative embodiment, one or more of the chamber data acquisition unit 570, the chamber control model 420, the chamber data storage 430, the metrology data storage unit 440, and the chamber characteristics/metrology data correlation 450 are individual standalone components in the system 400.

Figure 6:
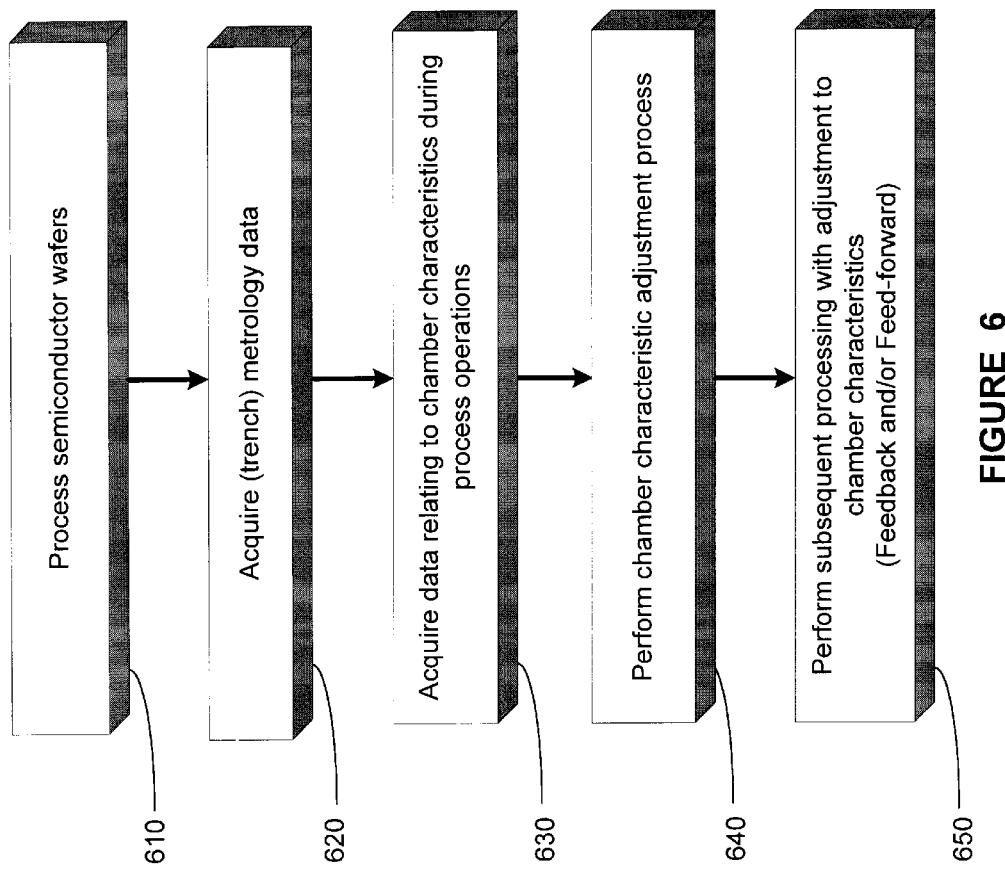
FIG. 6 illustrates a flowchart depiction of a method in accordance with one embodiment of the present invention.

Turning now to FIG. 6, a flowchart depiction of a method in accordance with one embodiment of the present invention is illustrated. A manufacturing lot of semiconductor wafers 105 are processed by the system 400 (block 610). In one embodiment, trench formations 250 are processed into one or more layers, or in the substrate, of the semiconductor wafers 105. In one embodiment, the trench structures are shallow-trench isolation (STI) structures. Once a process is performed on at least one semiconductor wafer 105, the system 400 acquires trench metrology data (i.e., data relating to trench structures, such as trench depth 250 and sidewall angles 320) from the processed semiconductor wafer 105 (block 620). The system 400 acquires the metrology data through the use of the metrology tool 550. In one embodiment, the metrology tool 550 is an optical measurement unit, such as a scatterometer. The metrology data acquired from the semiconductor wafer 105 includes an analysis of the trench structures formed on the semiconductor wafer 105. The acquired metrology data includes the angles 320 of the side-walls of the trench structures, the depth 250 of the trench structure, and critical dimension measurements of trenches on the semiconductor wafer 105. The acquired metrology data is stored in the metrology data storage unit 440.

The system 400 also acquires data relating to the chamber operation (block 630). In one embodiment, the chamber data acquisition unit 570 acquires data relating to the chamber characteristics during the operation of the processing tools 510. The data relating to the chamber operation is generally stored in the chamber data storage unit 430, which is accessible by the system 400. The data acquired includes the pressure, the temperature, and the condition of various process gasses that are used during processing of semiconductor wafers 105 within the chamber. The gasses that may be analyzed include, Chlorine, HBr, Oxygen ($O_2$), Helium ($H_x$), $CF_4$ gas, and the like.

Once the system 400 acquires metrology data and corresponding chamber characteristics data, the system 400 performs a chamber characteristic adjustment process (block 640). The chamber characteristic adjustment process is further defined in more detail below, as well as in FIG. 7. Continuing to refer to FIG. 6, upon conclusion of chamber characteristic adjustment process, the system 400 calculates modification parameters (which are described below) that can be made to the chamber operation in order to reduce the errors or deviations from target values for trench structures formed on subsequently processed semiconductor wafers 105. In one embodiment, the calculated modification parameters are used to adjust the chamber control model 420, which can modify the chamber characteristics/environment during process operations.

Once modifications to the chamber characteristics are calculated, the system 400 performs subsequent processing of semiconductor wafers 105 using the adjustments made to the chamber operations, which may result in reduced trench errors (block 650). Subsequent processing of semiconductor wafers 105 are performed by adjusting the chamber control model 420, which modifies the chamber characteristics/environment during processing of semiconductor wafers 105. The modification to the chamber operation can be made in a feedback manner as well as in a feed-forward manner. In a feedback mode, subsequent lots of semiconductor wafers 105 are affected by the modification to the chamber characteristics/environment, which generally produces trench structures with lower amounts of errors. Modification to the chamber characteristics/environment may result in formation of trench structures that have trench depths 250 and sidewall angles 320 that are within acceptable limits. In a feed-forward mode, the processed semiconductor wafers 105 are further processed in the chamber using modified chamber parameters, which may reduce the effects of the errors detected previously, or compensate for such errors. For example, if metrology indicates trenches too shallow, an additional etch step may be performed to increase the depth of the trenches.

Figure 7:
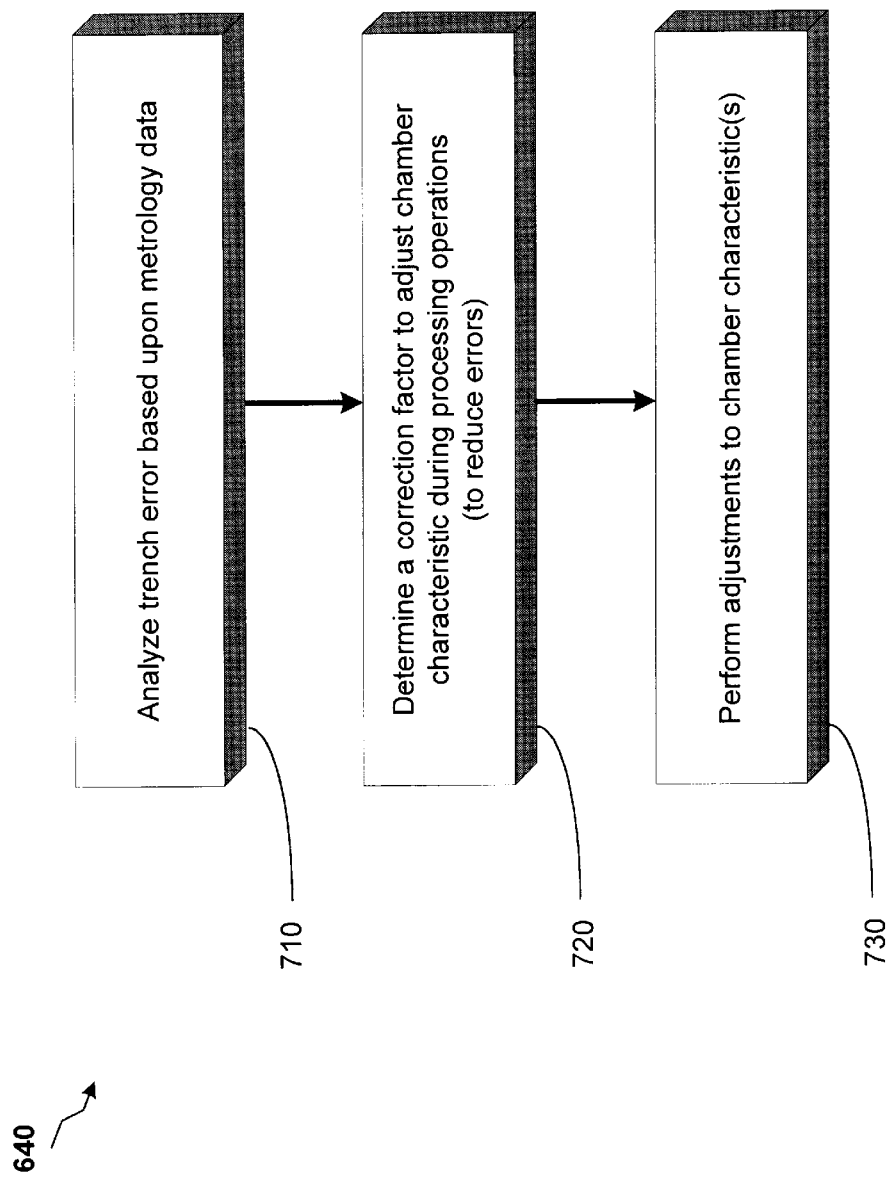
FIG. 7 illustrates a flowchart depiction of a method of performing a trench/chamber adjustment process described in FIG. 6, in accordance with one embodiment of the present invention.
Figure 8:
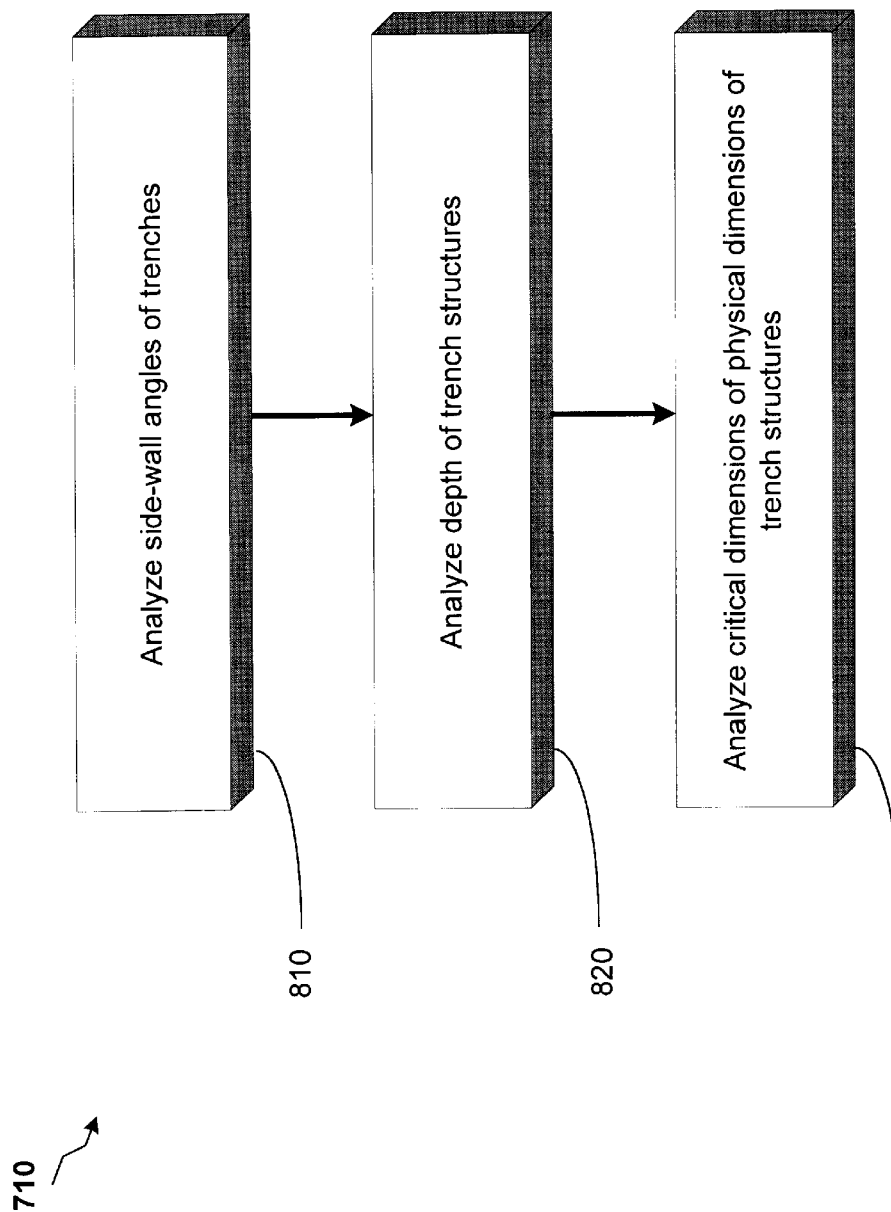
FIG. 8 illustrates a flowchart depiction of a method of analyzing trench errors based upon metrology data, as described in FIG. 7, in accordance with one embodiment of the present invention.

Turning now to FIG. 7, one embodiment of the steps for performing the chamber characteristic adjustment process indicated in block 640 of FIG. 6, is illustrated. In one embodiment, the system 400 analyzes trench errors based upon the acquired metrology data relating to trench structures on the processed semiconductor wafers (block 710). The trench structure error analysis, in one embodiment, is performed by the metrology data analysis unit 160. The metrology data analysis unit 160 correlates metrology data to particular semiconductor wafers 105 and forms a structure-to-error correlation. FIG. 8 illustrates one embodiment of the steps of analyzing the trench errors described in block 710 of FIG. 7.

Turning now to FIG. 8, the system 400 analyzes the side wall angles 320 of the trench structures from which metrology data is acquired (block 810). Generally, the system 400 requires that the side wall angles 320 be within a predetermined range of acceptable values for the proper operation of the device that will be formed on the processed semiconductor wafers 105. For example, for certain types of transistors, the side wall angle 320 should be within 80 to 87 degrees relation to a vertical plane. The system 400 notes an error relating to the sidewall angles 320 if the angles are outside a predetermined range, such as the sidewall angles 320 being outside the range of 80 to 87 degrees. In one embodiment, the structure of the trench structures is analyzed using optical measurement techniques, such as scatterometry measurements. The system 400 also analyzes the depth of the trench structures. Generally, the depth of the trench structures must be within a predetermined value or range of values for proper operation of the devices formed from the processed semiconductor wafers 105 (block 820). The system 400 also analyzes critical dimensions of certain physical structures on the semiconductor wafer 105 being processed. The system 400 utilizes the data described in FIG. 8 to determine whether significant amount of errors exist, based upon the trench metrology data.

Figure 9:
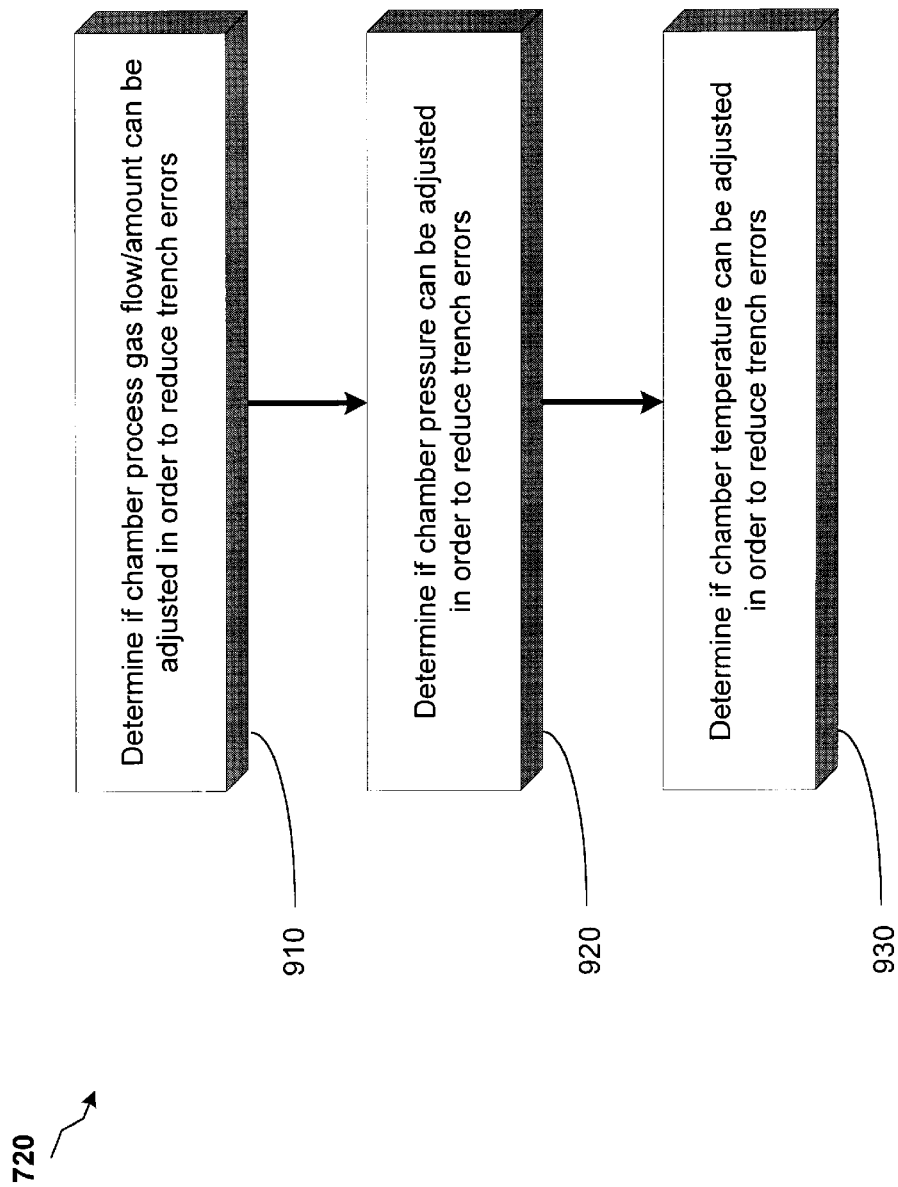
FIG. 9 illustrates a flowchart depiction of a method of determining a correction factor to adjust chamber operations, as described in FIG. 7, in accordance with one embodiment of the present invention.

Turning back to FIG. 7, after analyzing the trench errors based upon the metrology data (as indicated in block 710), the system 400 determines a correlation factor for adjusting chamber characteristics/environment in order to reduce the trench errors (block 720). The correction factor determined by the system 400 to adjust chamber characteristics/environment in order to reduce trench errors is at least partially performed by the chamber characteristics/metrology data correlation unit 450. The chamber characteristics/metrology data correlation unit 450 receives the metrology data relating to particular trench structures, as well as data relating to the chamber characteristics, and correlates the metrology data errors to particular chamber operation characteristics (e.g., chamber pressure, chamber temperature, and the amount of process gasses used during the processing of the semiconductor wafers 105). In one embodiment, the system 400 determines a correction factor by comparing the trench errors and correlating them to the chamber characteristic data. FIG. 9 illustrates a more detailed description of the determination of correction factor step indicated in block 720.

Turning now to FIG. 9, the system 400 determines if a particular process gas flow or gas content, can be adjusted in order to reduce the trench errors (block 910). For example, the system 400 determines whether an adjustment in the content and/or the flow rate of HBr, Chlorine, Oxygen, Helium, CF4 gas, and the like, can be made in order to modify trench formation and reduce trench errors. Based upon the pressure data of the chamber operation, the system 400 further determines whether a pressure adjustment can be made in order to reduce the chamber errors (block 920). A reduction or an increase in the chamber pressure during a process operation may affect the trench depth 320 of the trench structures that are formed during a processing operation. Furthermore, the system determines whether a change in the chamber operation temperature can be made in order to reduce the trench errors, which may affect trench characteristics (block 930). The calculations and determinations described in FIG. 9 can be made by those skilled in the art having the benefit of the present disclosure.

Turning back to FIG. 7, after determining a correction factor to adjust chamber operation in order to reduce the trench errors (as indicated in block 720), the system 400 performs adjustments to the chamber based upon the correction factors (block 730). The system 400 can modify chamber characteristics during a process operation by adjusting one or more control parameters in the chamber control model 420. Upon adjustments to the chamber operation, subsequent processing of semiconductor wafers 105, particularly in forming trench structures, can be performed with reduced amounts of errors, resulting in a higher yield of semiconductor devices.

The chamber operation is controlled and run using the chamber control model 420, which controls certain operation values for the operation of the chamber in the processing tools 510 during the processing of semiconductor wafers 105. Therefore, instead of shutting down a processing line to bring the chamber operation to a known steady state condition, the methods of the present invention allow for inline modification to the chamber operation in order to compensate for errors detected in trench structures, resulting in more efficient manufacturing of semiconductor devices. The teachings of the present invention can be utilized for a variety of processing procedures in semiconductor device manufacturing.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    processing at least one semiconductor wafer;
    acquiring a trench metrology data from said processed semiconductor wafer;
    acquiring data relating to at least one process chamber characteristic, said data acquired while processing said semiconductor wafer;
    performing a chamber characteristic adjustment process in response to said trench metrology data and said data relating to said processing chamber characteristic, said chamber characteristic adjustment process comprising correlating said metrology data to said process chamber characteristic and adjusting at least one characteristic relating to said chamber based upon said correlating; and
    performing a feedback adjustment of said processing chamber characteristic in response to said chamber characteristic adjustment process, for processing at least another semiconductor wafer.

2. The method described in claim 1, further comprising performing a feed-forward adjustment process of said processing chamber characteristic in response to said chamber characteristic adjustment process.

3. The method described in claim 1, wherein processing at least one semiconductor wafer further comprises forming a trench structure on said semiconductor wafer.

4. The method described in claim 1, wherein acquiring said trench metrology data from said processed semiconductor wafer comprises acquiring at least one of a trench depth measurement, a trench side-wall angle measurement, and a trench critical dimension measurement.

5. The method described in claim 1, wherein acquiring data relating to at least one chamber characteristic during said processing of semiconductor wafer further comprises acquiring a chamber pressure measurement, a chamber temperature measurement, and a process gas measurement.

6. The method described in claim 1, wherein performing a chamber characteristic adjustment process in response to said trench metrology data and said data relating to said chamber characteristic further comprises:
    analyzing trench errors based upon said trench metrology data;

correlating at least one trench error to a chamber characteristic based upon said analysis of trench errors;

determining a correction factor for adjusting at least one chamber characteristic based upon said correlated trench error; and performing at least one adjustment to said chamber characteristic based upon said correction factor.

7. The method described in claim 6, wherein analyzing trench errors based upon said trench metrology data further comprises determining at least one of a trench depth error, a trench side-wall angle error, and a trench critical dimension error.

8. The method described in claim 6, wherein determining a correction factor for adjusting at least one chamber characteristic based upon said correlated trench error further comprises determining an adjustment for at least one of a chamber pressure, a chamber temperature, and a chamber process gas.

9. A method, comprising:

processing at least one semiconductor wafer to form at least one trench structure in said semiconductor wafer;

acquiring a trench metrology data from said processed semiconductor wafer;

acquiring data relating to at least one process chamber characteristic, said data acquired while processing said semiconductor wafer;

analyzing trench errors based upon said trench metrology data;

correlating at least one trench error to a processing chamber characteristic based upon said analysis of trench errors;

determining a correction factor for adjusting at least one chamber characteristic based upon said correlated trench error;

performing at least one adjustment to said chamber characteristic based upon said correction factor and performing a feedback adjustment of said processing chamber characteristic in response to said chamber characteristic adjustment process, for processing at least another semiconductor wafer.

10. The method described in claim 9, wherein acquiring said trench metrology data from said processed semiconductor wafer comprises acquiring at least one of a trench depth measurement, a trench side-wall angle measurement, and a trench critical dimension measurement.

11. The method described in claim 9, wherein acquiring data relating to at least one chamber characteristic during said processing of semiconductor wafer further comprises acquiring a chamber pressure measurement, a chamber temperature measurement, and a process gas measurement.

12. The method described in claim 9, wherein analyzing trench errors based upon said trench metrology data further comprises determining at least one of a trench depth error, a trench side-wall angle error, and a trench critical dimension error.

13. The method described in claim 9, wherein determining a correction factor to adjust at least one chamber characteristic based upon said correlated trench error further comprises determining an adjustment for at least one of a chamber pressure, a chamber temperature, and a chamber process gas.

14. A system, comprising:

a metrology data storage unit to receive trench metrology data;

a chamber data storage to receive chamber characteristic data relating to a processing of a semiconductor wafer;

a chamber characteristic/metrology data correlation unit operatively coupled with said metrology data storage unit and said chamber data storage unit, said chamber characteristic/metrology data correlation unit to correlate said trench metrology data with corresponding chamber characteristic data; and a chamber control model to modify a chamber characteristic during a time period of processing of a semiconductor wafer based upon said correlated trench metrology data and corresponding chamber characteristic data.

15. The system of claim 14, further comprising:

a computer system operatively coupled with said chamber control model, said computer system to modify said chamber control model in response to said computer system calculating trench error;

a manufacturing model operatively coupled with said computer system, said manufacturing model to generate and modify at least one control input parameter signal;

a machine interface operatively coupled with said manufacturing model, said machine interface being capable of receiving process recipes from said manufacturing model;

a processing tool capable of processing semiconductor wafers and coupled with said machine interface, said first processing tool being capable of receiving at least one control input parameter signal from said machine interface;

a metrology tool operatively coupled with said first processing tool and said second processing tool, said metrology tool to acquire trench metrology data and send said trench metrology data to said metrology data storage unit;

a chamber data acquisition unit operatively coupled with said processing tool, said chamber data acquisition to acquire chamber characteristic data and send said chamber characteristic data to said chamber data storage.

16. The system of claim 15, wherein said computer system is adapted to calculate a trench depth error, a trench side-wall angle error, and a trench critical dimension error based upon said trench metrology data.

17. The system of claim 16, wherein said computer system is capable of generating modification data for modifying at least one parameter in said chamber control model in response to said correlating said corresponding chamber characteristic data with at least one of said trench depth error, said trench side-wall angle error, and said trench critical dimension error.

18. The system of claim 17, wherein said chamber control model is capable of modifying at least one of said a chamber pressure, a chamber temperature, and a chamber process gas.

19. An apparatus, comprising:

means for processing at least one semiconductor wafer to form at least one trench structure in said semiconductor wafer;

means for acquiring a trench metrology data from said processed semiconductor wafer;

means for acquiring data relating to at least one process chamber characteristic, said data acquired while processing said semiconductor wafer;

means for analyzing trench errors based upon said trench metrology data;

means for correlating at least one trench error to a processing chamber characteristic based upon said analysis of trench errors;

means for determining a correction factor for adjusting at least one chamber characteristic based upon said correlated trench error;

means for performing at least one adjustment to said chamber characteristic based upon said correction factor and means for performing a feedback adjustment of said processing chamber characteristic in response to said chamber characteristic adjustment process, for processing at least another semiconductor wafer.

20. A computer readable program storage device encoded with instructions that, when executed by a computer, performs a method, comprising:

processing at least one semiconductor wafer;

acquiring a trench metrology data from said processed semiconductor wafer;

acquiring data relating to at least one process chamber characteristic, said data acquired while processing said semiconductor wafer;

performing a chamber characteristic adjustment process in response to said trench metrology data and said data relating to said processing chamber characteristic, said chamber characteristic adjustment process comprising correlating said metrology data to said process chamber characteristic and adjusting at least one characteristic relating to said chamber based upon said correlating; and performing a feedback adjustment of said processing chamber characteristic in response to said chamber characteristic adjustment process, for processing at least another semiconductor wafer.

21. The computer readable program storage device encoded with instructions that, when executed by a computer, performs the method described in claim 20, the method further comprising performing a feed-forward adjustment process of said chamber characteristic in response to said chamber characteristic adjustment process.

22. The computer readable program storage device encoded with instructions that, when executed by a computer, performs the method described in claim 20, wherein processing at least one semiconductor wafer further comprises forming a trench structure on a layer of said semiconductor wafer.

23. The computer readable program storage device encoded with instructions that, when executed by a computer, performs the method described in claim 20, wherein acquiring said trench metrology data from said processed semiconductor wafer comprises acquiring at least one of a trench depth measurement, a trench side-wall angle measurement, and a trench critical dimension measurement.

24. The computer readable program storage device encoded with instructions that, when executed by a computer, performs the method described in claim 20, wherein acquiring data relating to at least one chamber characteristic during said processing of semiconductor wafer further comprises acquiring a chamber pressure measurement, a chamber temperature measurement, and a process gas measurement.

25. The computer readable program storage device encoded with instructions that, when executed by a computer, performs the method described in claim 20, wherein performing a chamber characteristic adjustment process in response to said trench metrology data and said data relating to said chamber characteristic further comprises:

analyzing trench errors based upon said trench metrology data;

correlating at least one trench error to a chamber characteristic based upon said analysis of trench errors;

determining a correction factor for adjusting at least one chamber characteristic based upon said correlated trench error; and performing at least one adjustment to said chamber characteristic based upon said correction factor.

26. The computer readable program storage device encoded with instructions that, when executed by a computer, performs the method described in claim 25, wherein analyzing trench errors based upon said trench metrology data further comprises determining at least one of a trench depth error, a trench side-wall angle error, and a trench critical dimension error.

27. The computer readable program storage device encoded with instructions that, when executed by a computer, performs the method described in claim 25, wherein determining a correction factor for adjusting at least one chamber characteristic based upon said correlated trench error further comprises determining an adjustment for at least one of a chamber pressure, a chamber temperature, and a chamber process gas.

* * * * *